(12) United States Patent
Nystrom et al.

(10) Patent No.: US 9,421,772 B2
(45) Date of Patent: Aug. 23, 2016

(54) METHOD OF MANUFACTURING INK JET PRINTHEADS INCLUDING ELECTROSTATIC ACTUATORS

(71) Applicant: Xerox Corporation, Norwalk, CT (US)

(72) Inventors: Peter J. Nystrom, Webster, NY (US); Gary D. Redding, Victor, NY (US); Mark A. Cellura, Webster, NY (US)

(73) Assignee: XEROX CORPORATION, Norwalk, CT (US)

( * ) Notice: Subject to any disclaimer, the term of this patent is extended or adjusted under 35 U.S.C. 154(b) by 0 days.

(21) Appl. No.: 14/561,519

(22) Filed: Dec. 5, 2014

(65) Prior Publication Data

US 2016/0159091 A1    Jun. 9, 2016

(51) Int. Cl.
*B41J 2/16*    (2006.01)
*B41J 2/14*    (2006.01)
*B81C 1/00*    (2006.01)

(52) U.S. Cl.
CPC .............. *B41J 2/1621* (2013.01); *B41J 2/1433* (2013.01); *B41J 2/162* (2013.01); *B41J 2/1626* (2013.01); *B41J 2/1623* (2013.01); *B41J 2/1635* (2013.01); *B41J 2/1639* (2013.01); *B81C 1/00158* (2013.01); *B81C 1/00214* (2013.01); *B81C 1/00523* (2013.01); *Y10T 29/49126* (2015.01); *Y10T 29/49401* (2015.01); *Y10T 29/49798* (2015.01)

(58) Field of Classification Search
CPC ........ B41J 2/1433; B41J 2/162; B41J 2/1623; B41J 2/1635; B41J 2/1639; B41J 2/1621; B41J 2/1626; B81C 1/00214; B81C 1/00523; B81C 1/00158; Y10T 29/49126; Y10T 29/49401; Y10T 29/49798
See application file for complete search history.

(56) References Cited

U.S. PATENT DOCUMENTS

| | | | |
|---|---|---|---|
| 5,820,771 A * | 10/1998 | Burke et al. | ........... B41J 2/1639 216/2 |
| 6,164,759 A | 12/2000 | Fujii et al. | |
| 6,416,168 B1 * | 7/2002 | Silverbrook | ........... B41J 2/1635 347/20 |
| 7,566,118 B2 | 7/2009 | Bibl et al. | |
| 8,029,102 B2 * | 10/2011 | Silverbrook | ........... B41J 2/1635 347/54 |
| 8,455,271 B2 | 6/2013 | Nystrom et al. | |

FOREIGN PATENT DOCUMENTS

JP    2011102036 A  *  5/2011

\* cited by examiner

*Primary Examiner* — A. Dexter Tugbang
(74) *Attorney, Agent, or Firm* — MH2 TECHNOLOGY LAW GROUP LLP

(57) ABSTRACT

A method for forming a plurality of electrostatic actuator membranes for an electrostatically actuated ink jet printhead. The method can include forming a blanket actuator membrane layer on an etch stop layer, where the etch stop layer is interposed between the blanket membrane layer and a handle layer such as a semiconductor wafer. The blanket actuator membrane layer is patterned to form a plurality of actuator membranes. The plurality of actuator membranes is attached to a printhead drive assembly that includes circuitry for actuating the plurality of actuator membranes. Subsequently, the handle layer and etch stop layer are removed, thereby leaving the plurality of actuator membranes attached to the printhead drive assembly.

14 Claims, 8 Drawing Sheets

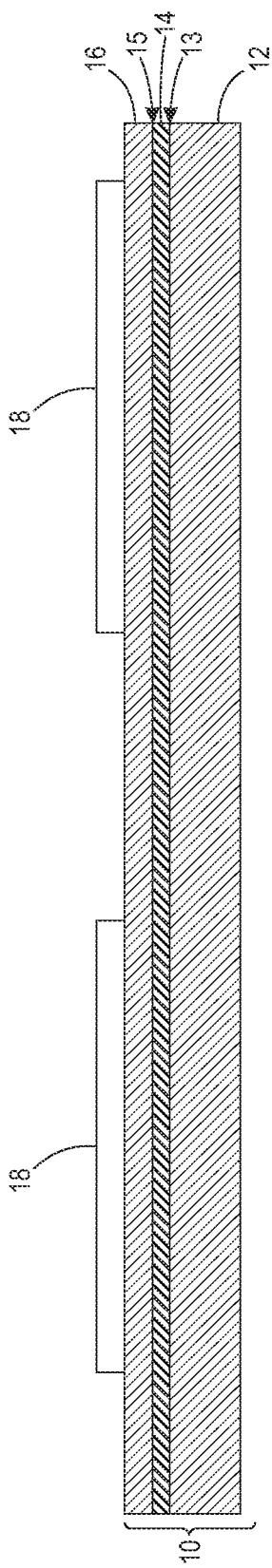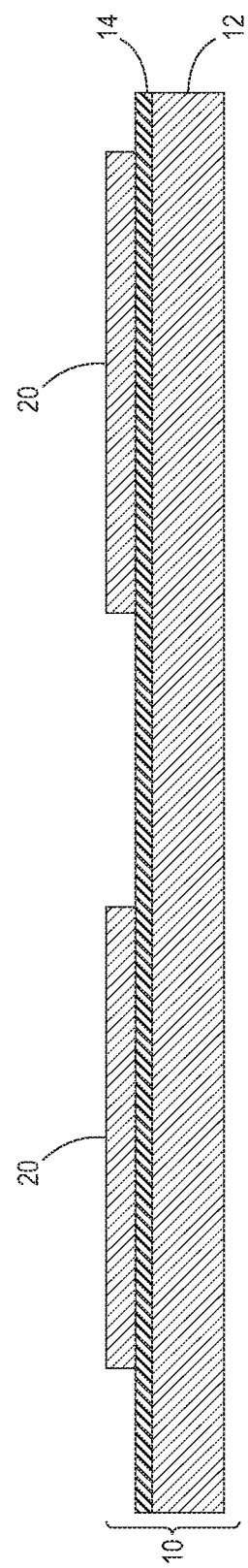

METHOD OF MANUFACTURING INK JET PRINTHEADS INCLUDING ELECTROSTATIC ACTUATORS

TECHNICAL FIELD

The present teachings relate to the field of ink jet printing devices and, more particularly, to methods and structures for electrostatically actuated ink jet printheads and a printer including an electrostatically actuated ink jet printhead.

BACKGROUND

Drop on demand ink jet technology is widely used in the printing industry. Printers using drop on demand ink jet technology typically use either thermal ink jet technology or piezoelectric technology. Even though they are more expensive to manufacture than thermal ink jets, piezoelectric ink jets are generally favored, for example because they can use a wider variety of inks.

Piezoelectric ink jet print heads include an array of piezoelectric elements (i.e., transducers or PZTs). One process to form the array can include detachably bonding a blanket piezoelectric layer to a transfer carrier with an adhesive, then dicing the blanket piezoelectric layer to form a plurality of individual piezoelectric elements. A plurality of dicing saw passes can be used to remove all the piezoelectric material between adjacent piezoelectric elements to provide the correct spacing between each piezoelectric element.

Piezoelectric ink jet print heads can typically further include a flexible diaphragm to which the array of piezoelectric elements is attached. When a voltage is applied to a piezoelectric element, typically through electrical connection with an electrode electrically coupled to a power source, the piezoelectric element bends or deflects, causing the diaphragm to flex which expels a quantity of ink from a chamber through a nozzle (i.e., aperture or orifice) in an aperture plate (i.e., nozzle plate). The flexing further draws ink into the chamber from a main ink reservoir through an opening to replace the expelled ink.

Piezoelectric elements can be manufactured from a bulk material that includes lead. To reduce the impact of lead-based piezoelectric actuators on the environment, other ink ejection technologies have been researched. For example, electrostatic actuators include the use of an electrode that, when powered through a supplied voltage, attracts and flexes a silicon membrane (e.g., a diaphragm) to draw ink from an ink supply into an ink chamber formed in part by the membrane. When the voltage is removed from the electrode, the silicon membrane relaxes, thereby increasing pressure in the ink chamber and ejecting ink from a nozzle in an aperture plate.

As printing technologies improve, the physical size of the actuators decreases, with a corresponding increase of in the number of nozzles and actuators within a given area of the printhead. Forming actuator membranes for electrostatically actuated ink jet printheads becomes increasingly difficult with decreasing sizes. For example, with current technology, a rectangular actuator membrane for an electrostatically actuated printhead may have an area of about 4 mm by 12 mm. These small actuators are difficult to form and are prone to cracking.

A simplified method for forming an array of electrostatic actuators that increases manufacturing throughput would be desirable.

SUMMARY

The following presents a simplified summary in order to provide a basic understanding of some aspects of one or more embodiments of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

In an embodiment, a method for forming an ink jet printhead having an electrostatic actuator array can include forming a plurality of actuator membranes on a first surface of an etch stop layer, wherein each of the plurality of actuator membranes is laterally spaced from an adjacent actuator membrane, the etch stop layer is interposed between a handle layer and the plurality of actuator membranes, and the handle layer is attached to a second surface of the etch stop layer. The method can further include attaching the plurality of actuator membranes to a printhead drive assembly, wherein the printhead drive assembly comprises circuitry for actuating the plurality of actuator membranes. Subsequent to the attaching of the plurality of actuator membranes to the printhead drive assembly, the handle layer may be removed to expose the second surface of the etch stop layer. Subsequent to removing the handle layer, the etch stop layer may be removed.

In another embodiment, a method for forming an ink jet printer having an ink jet printhead, the ink jet printhead having electrostatic actuator array, the method including forming a plurality of actuator membranes on a first surface of an etch stop layer, wherein each of the plurality of actuator membranes is laterally spaced from an adjacent actuator membrane, the etch stop layer is interposed between a handle layer and the plurality of actuator membranes, and the handle layer is attached to a second surface of the etch stop layer. The method can further include attaching the plurality of actuator membranes to a printhead drive assembly, wherein the printhead drive assembly comprises circuitry for actuating the plurality of actuator membranes. Subsequent to the attaching of the plurality of actuator membranes to the printhead drive assembly, the handle layer may be removed to expose the second surface of the etch stop layer. Subsequent to removing the handle layer, the etch stop layer may be removed. The plurality of actuator membranes and the printhead drive assembly may then be encased within a printer housing.

Another embodiment can include an in-process structure for a plurality of ink jet printheads comprising a plurality of electrostatic actuator arrays, wherein each printhead comprises at least one electrostatic actuator array from the plurality of electrostatic actuator arrays. The in-process structure can include a first semiconductor wafer substrate assembly having an etch stop layer having a first surface and a second surface opposite the first surface, a plurality of electrostatic actuator membranes for the plurality of ink jet printheads, wherein each electrostatic actuator membrane is laterally spaced from an adjacent electrostatic actuator membrane and each electrostatic actuator membrane is attached to the first surface of the etch stop layer, and a handle layer attached to the second surface of the etch stop layer, wherein the etch stop layer is interposed between the handle layer and the plurality of actuator membranes. The in-process structure can further include a second semiconductor wafer substrate assembly different from the first semiconductor wafer substrate assembly, wherein the second semiconductor wafer substrate assembly comprises a plurality of printhead drive assemblies for the plurality of printheads.

BRIEF DESCRIPTION OF THE DRAWINGS

The accompanying drawings, which are incorporated in, and constitute a part of this specification, illustrate embodiments of the present teachings and, together with the description, serve to explain the principles of the disclosure. In the figures:

FIGS. 1-7 are cross sections depicting various in-process assemblies for an electrostatic actuator array formed in accordance with an embodiment of the present teachings;

Figure 3:
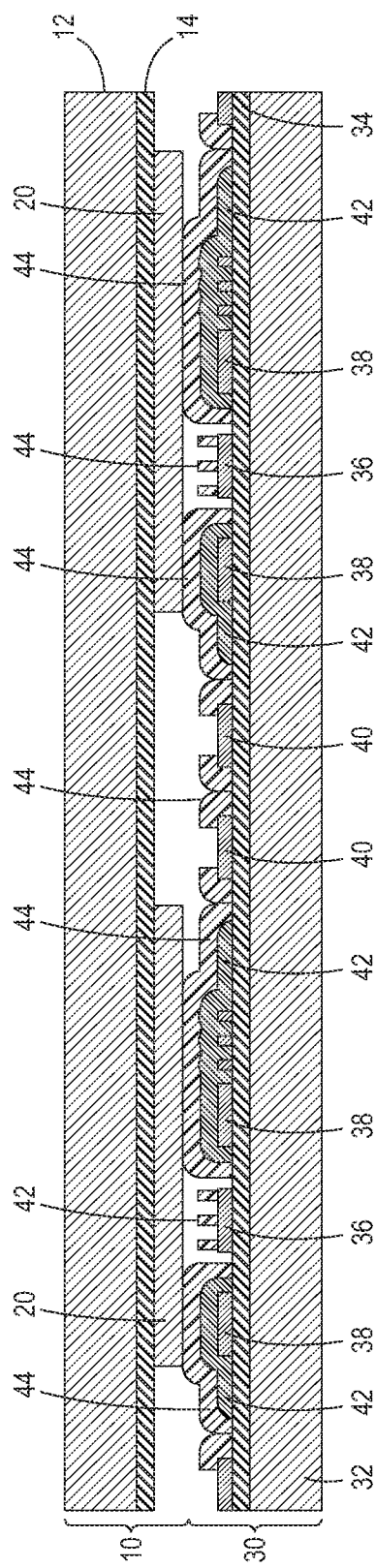

It should be noted that some details of the FIGS. have been simplified and are drawn to facilitate understanding of the present teachings rather than to maintain strict structural accuracy, detail, and scale.

DETAILED DESCRIPTION

Reference will now be made in detail to exemplary embodiments of the present teachings, examples of which are illustrated in the accompanying drawings. Wherever possible, the same reference numbers will be used throughout the drawings to refer to the same or like parts.

As used herein, unless otherwise specified, the word "printer" encompasses any apparatus that performs a print outputting function for any purpose, such as a digital copier, bookmaking machine, facsimile machine, a multi-function machine, electrostatographic device, etc.

An embodiment of the present teachings can provide a plurality (i.e., an array) of electrostatic actuator membranes that are simultaneously assembled onto a printhead subassembly, where the subassembly includes a plurality of electrostatic actuator electrodes. An embodiment can further provide a plurality of electrostatic actuator membrane arrays that are simultaneously assembled onto a plurality of different printhead dies for a plurality of different printheads. The printhead assembly process described herein can streamline the assembly process and increase device yields, thereby resulting in decreased manufacturing costs.

In-process structures which can be formed during an embodiment of the present teachings are depicted in the cross sections of FIGS. 1-7. It will be appreciated that structures and processes in accordance with the present teachings may include other processing steps or substructures that are not depicted for simplicity, and that depicted processes or substructures may be removed or modified.

FIG. 1 depicts a semiconductor wafer substrate assembly in accordance with an embodiment of the present teachings. The assembly can include a silicon-on-insulator (SOI) assembly 10, which may also be referred to as a silicon-on-insulator-on-silicon (SOIS) assembly. The SOI assembly 10 can include a handle layer 12, an insulator layer 14, and a blanket membrane layer 16, wherein the insulator layer 14 is interposed between the handle layer 12 and the blanket membrane layer 16. The handle layer 12 can be, for example, a silicon or other semiconductor handle wafer having a thickness of from about 50 µm to about 5,000 µm, or from about 100 µm to about 2,500 µm, or from about 200 µm to about 800 µm. The insulator layer 14, which may be a silicon oxide that is grown or deposited on the handle layer 12, can have a thickness of from about 0.5 µm to about 25 µm, or from about 1.0 µm to about 10 µm, or from about 2.0 µm to about 6.0 µm. The blanket membrane layer 16, which may be silicon or another semiconductor, can have a thickness of from about 1.0 µm to about 100 µm, or from about 5.0 µm to about 50 µm, or from about 8.0 µm to about 25 µm. The FIG. 1 structure can be formed by one of ordinary skill in the art from the description herein. The SOI assembly 10 may be part of a complete intact semiconductor wafer, or part of a semiconductor wafer section that has been sectioned from a semiconductor wafer. As depicted in FIG. 1, the handle layer 12 is positioned on, or otherwise attached to, a first surface 13 of the insulator layer 14, and the blanket membrane layer 16 is positioned on, or otherwise attached to, a second surface 15 of the insulator layer 14.

After forming the SOI assembly 10, a patterned mask 18 is formed on or over the blanket membrane layer 16 as depicted in FIG. 1. The patterned mask 18 may be a photoresist layer formed using, for example, conventional lithography techniques, a polymer mask formed using, for example, laser etching, etc. The mask 18 covers first portions of the blanket membrane layer 16 and leaves second portions of the blanket membrane layer 16 exposed.

Subsequently, the blanket membrane layer 16 of FIG. 1 is etched using the mask 18 as a pattern, and the mask 18 is removed to result in a structure similar to that depicted in FIG. 2. The FIG. 2 structure includes an array of actuator membranes 20 positioned on (e.g., attached to) the second surface 15 of the etch stop layer 14. At the depicted cross-sectional location, each actuator membrane 20 is laterally separated or spaced from an adjacent actuator membrane 20 by a distance or space. It will be appreciated that two or more adjacent actuator membranes 20 may be physically connected at a different cross-sectional location, depending on the device design.

Next, the etched SOI assembly 10 of FIG. 2 is aligned with, and attached or bonded to, a printhead drive assembly 30 as depicted in FIG. 3. In an embodiment, each electrostatic actuator membrane 20 may be physically attached to the drive assembly 30, as depicted. The drive assembly 30 can include, for example, a silicon substrate 32 such as a silicon wafer, and a dielectric layer 34 such as a blanket oxide layer. The drive assembly 30 can further include drive circuitry, including a plurality of actuator electrodes 36, a plurality of drive circuitry electrodes 38 that provide a plurality of transistor gates, and a plurality of application-specific integrated circuit (ASIC) pads 40, each of which may be electrically insulated at one or more locations from the silicon wafer 32 by the oxide layer 34. The drive circuitry of the printhead drive assembly 30 is configured to actuate the plurality of actuator membranes 20 during operation and use of the printhead, and may provide other printhead functionality. The drive assembly 30 may further include one or more conformal dielectric layers such as an inner silicon oxide layer 42 and an outer nitride layer 44.

The alignment of the SOI assembly 10 and the drive assembly 30 may be performed such that each electrostatic actuator membrane 20 is aligned with, and directly over, one of the actuator electrodes 36 as depicted. Each actuator membrane 20 may be attached to the outer conformal dielectric layer 44 using, for example, standard wafer bonding techniques, an anodic bonding process, an adhesive (not depicted for simplicity), etc. While the FIGS. depict two electrostatic actuators 20, it will be appreciated that each die for each printhead may have hundreds or thousands of electrostatic actuators 20, where each electrostatic actuator 20 may be individually and uniquely addressed using the drive circuitry of the to eject ink from one or more nozzles. Thus there may be a plurality of actuator electrodes 36 directly underneath each electrostatic actuator 20. Additionally, the SOI assembly 10 and the drive assembly 30 may include portions of a plurality of different dies for a plurality of different printheads.

Figure 4:
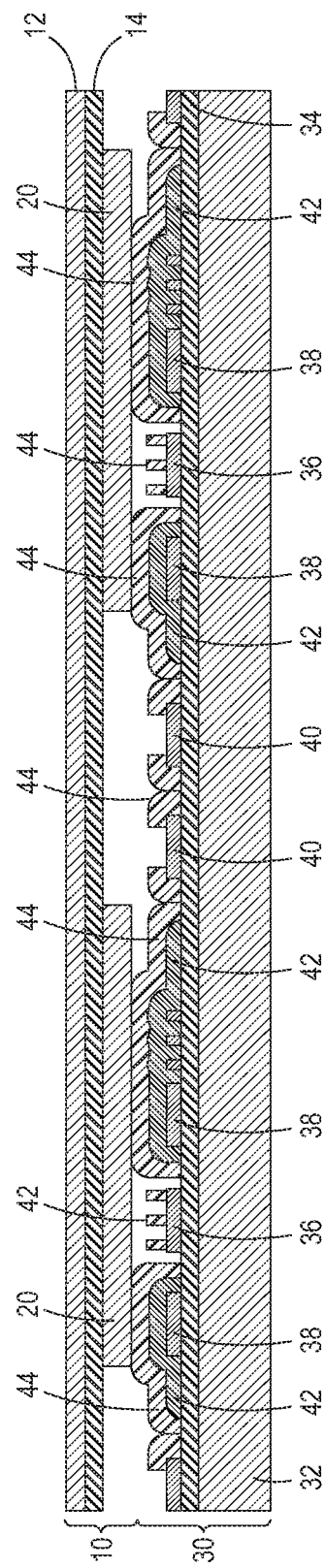

After attaching the SOI assembly 10 to the drive assembly 30, the handle layer 12 may be thinned as depicted in FIG. 4. To decrease manufacturing time, the thinning of the handle layer 12 may be performed using a rapid removal process having a high etch or removal rate. Removal techniques can include one or more of a semiconductor backgrind, a wet or dry etch having a high etch rate, a chemical, mechanical, or chemical-mechanical planarization having a high removal rate, etc., and combinations of these. Various etch chemistries are contemplated, for example, a dry etch such as a plasma-assisted etch including one or more of sulfur hexafluoride ($SF_6$), carbon tetrafluoride ($CF_4$), $CF_4/O_2$, chlorine gas ($Cl_2$), hydrogen bromide (HBr), combinations thereof, or another suitable dry etch. Wet etches are also contemplated, for example potassium hydroxide (KOH), tetramethylammonium hydroxide (TMAH), xenon difluoride ($XeF_2$), combinations thereof, or another suitable wet etch. With isotropic etches, masking (not depicted for simplicity) of the interface between the two wafers may be necessary to protect the printhead drive assembly 30 from the etch.

The rapid thinning of the handle layer 12 can be a timed removal process which terminates prior to exposure of the insulator layer 14. The thinning can remove a first thickness of the handle layer 12 while leaving a second thickness of the handle layer 12 remaining. It will be appreciated that the thinning of the handle layer 12 can be performed to completely remove the handle layer 12 using a slower process and using the insulator layer 14 as an etch stop, at the expense of decreased production throughput.

Figure 5:
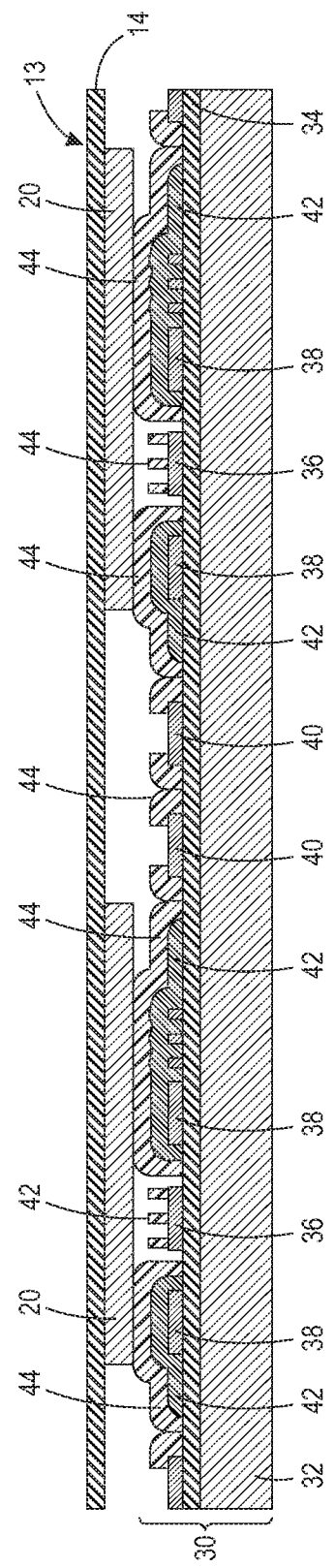

Subsequently, the remaining second thickness of the handle layer 12 as depicted in FIG. 4 can be completely removed to expose the first surface 13 of the insulator layer 14 as depicted in FIG. 5, for example using a slow removal process having a slow etch rate. The insulator layer 14 may be used as an etch stop layer. In an embodiment, the thinned handle layer 12 may be removed using a wet or dry etch that removes the material of the handle layer 12, for example silicon, selective to insulator layer 14, for example oxide. If an etch is selected that has a high selectivity to the material of the insulator layer (i.e., an etch that removes the handle layer 12 while removing little or no exposed insulator layer 14), a higher etch rate may be achieved. Various etch chemistries are contemplated, for example a wet or dry etch as described above or another suitable etch.

Figure 6:
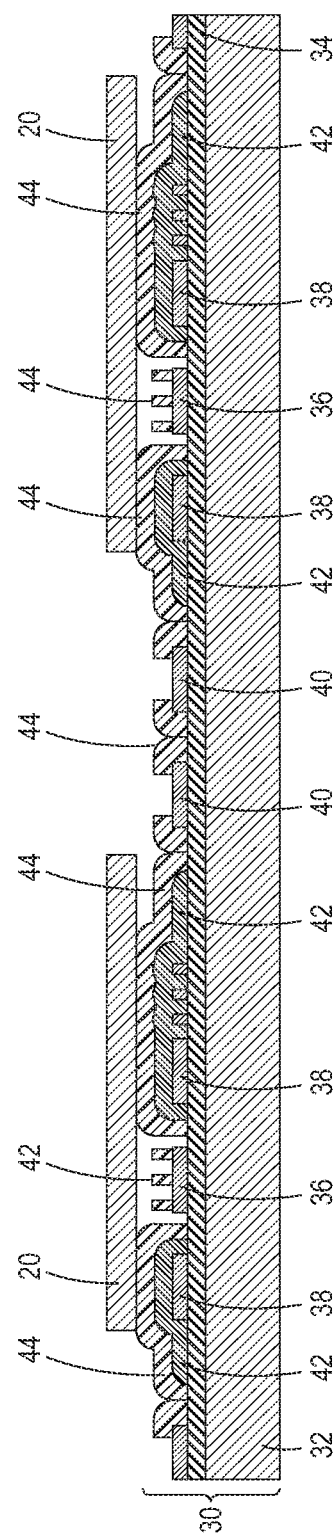

Next, the insulator layer 14 is completely removed to result in a structure similar to that depicted in FIG. 6. The insulator layer 14 may be removed using an etchant that removes the insulator layer 14, such as oxide, selective to the materials that are exposed on the drive assembly 30, such as the nitride outer conformal layer 44, the pads 40, and the actuator electrodes 36. Various etches are contemplated, for example, a dry etch including one or more of tetrahydridocarbon ($CF_4$, methane), a mixture of $CF_4$ and hydrogen gas ($H_2$), hexafluoroethane ($C_2F_6$), trifluoromethane ($CHF_3$) or another suitable dry etch, or a wet etch including one or more of hydrogen fluoride (HF) or a buffered oxide etch (BOE), as well as other suitable wet or dry etches.

Figure 7:
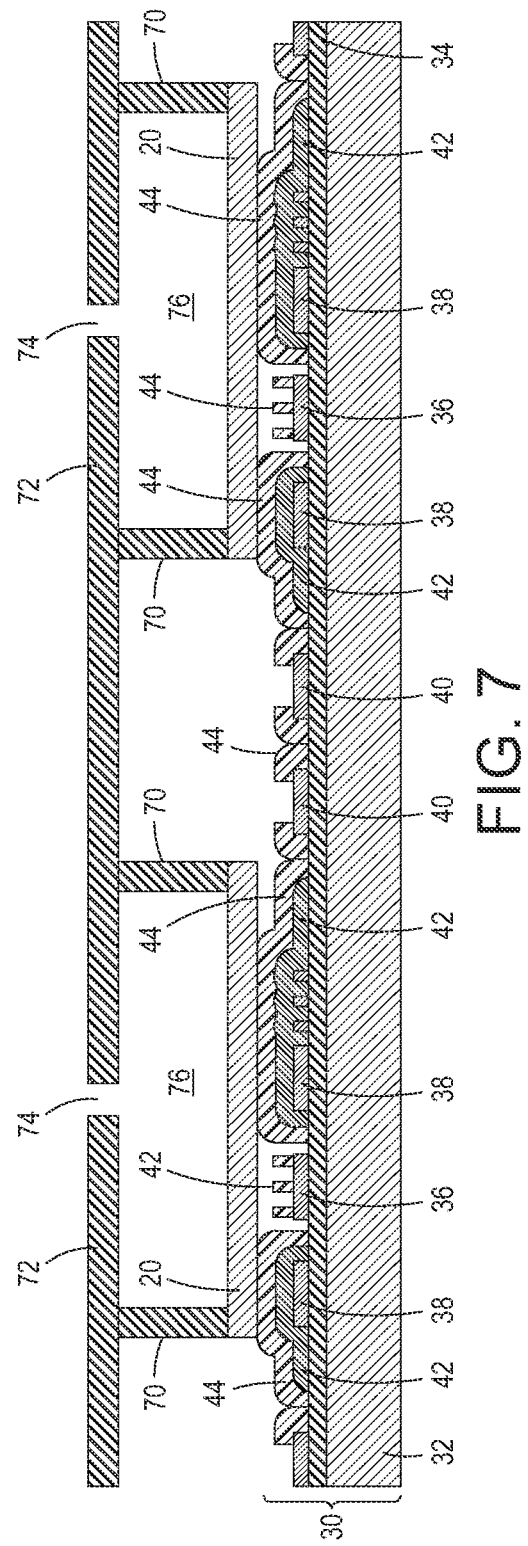

Next, additional layers are completed in accordance with techniques known in the art to form a completed printhead. As depicted in FIG. 7, additional layers formed may include the one or more standoff layers 70. Subsequently, an aperture plate 72 having a plurality of nozzles 74 therein may be attached to the one or more standoff layers 70. As depicted in FIG. 7, the aperture plate 72 is indirectly attached to the drive assembly 30 and the plurality of actuator membranes 20 through direct attachment to the one or more standoff layers 70. The actuator membrane 20, standoff layers 70, and aperture plate 72 thus form a plurality of ink chambers 76, wherein each ink chamber 76 is defined, at least in part, by a surface of an actuator membrane 20, a surface of the one or more standoff layers 70, and a surface of the aperture plate 72. During use, the ink chambers 76 are filled within ink 96 (FIG. 9), which is ejected from the nozzles 74 during actuation of the actuator membrane 20 using a voltage applied to the actuator electrodes 36.

It will be appreciated that FIG. 7 is a simplified schematic depiction to facilitate understanding of the present teachings, and that an actual printhead may include additional structures that are not depicted for simplicity, and that depicted structures may be removed or modified. Further, the structure of FIG. 7 may be part of a wafer-level assembly prior to dicing of the wafer, a portion of a single semiconductor die subsequent to dicing, or an assembly formed on a wafer section that has been diced prior to structure formation.

Figure 8:
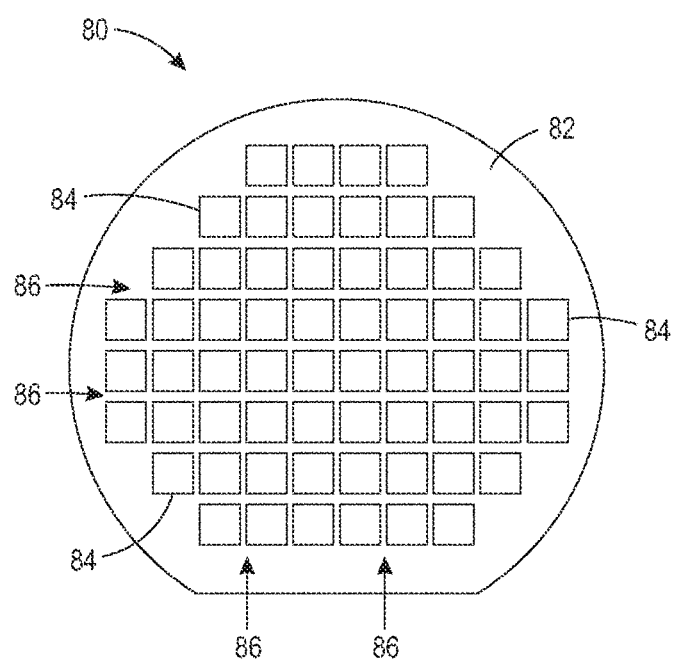
FIG. 8 is a plan view of a semiconductor wafer substrate assembly including a plurality of dies for a plurality of printheads, where each die corresponds to a different printhead.
Figure 9:
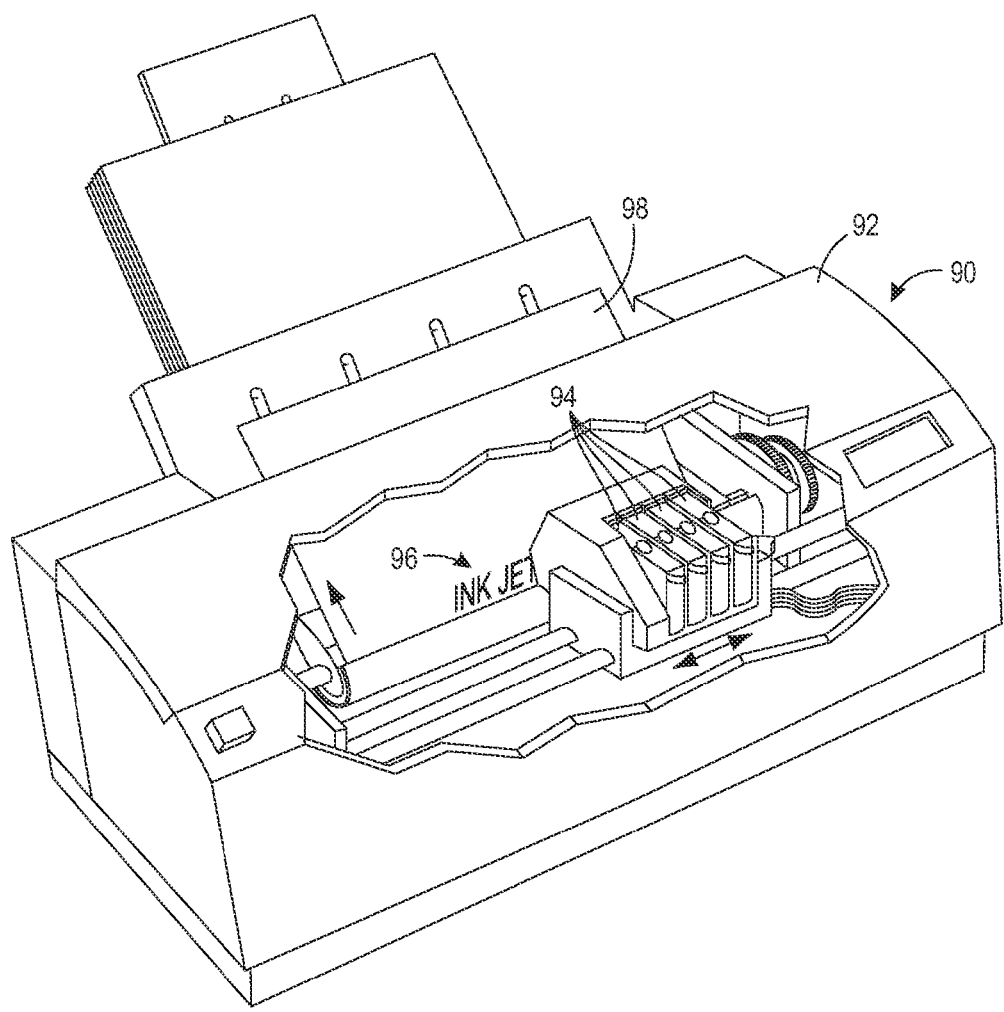
FIG. 9 is a perspective depiction of a printer including one or more electrostatically actuated printheads according to an embodiment of the present teachings.

FIG. 8 depicts a plan view of an in-process semiconductor wafer substrate assembly 80 that may be formed in accordance with an embodiment of the present teachings. The semiconductor wafer substrate assembly 80 includes a semiconductor wafer 82 that provides the handle layer 12. The semiconductor wafer substrate assembly 80 includes a plurality of semiconductor dies 84, wherein each die 84 of the plurality of dies 84 may be used to form a single printhead 94 (FIG. 9). Each die 84 includes an array of actuator membranes 20. An analogous in-process second semiconductor wafer substrate assembly (which may appear similar to FIG. 8 and is thus, for simplicity, is not individually depicted) can include a plurality of dies having a plurality of printhead drive assemblies, wherein each printhead drive assembly 30 (FIG. 7) is for one of the plurality of printheads. The first semiconductor wafer substrate assembly 80, and the second semiconductor wafer substrate assembly having the printhead drive assembly 30, may be formed using microfabrication techniques. Thus an embodiment of the present teachings allows for the simultaneous formation of a plurality of semiconductor dies 84 for a plurality of printheads 94 on a single semiconductor wafer 82. Subsequently, the plurality of actuator membranes 20 on each die 84 may be attached in wafer form to the analogous second semiconductor wafer substrate assembly including the plurality of printhead drive assemblies 30 as described above. The plurality of dies 84 in wafer form may then be singularized into a plurality of individual dies by dicing the semiconductor wafers along kerf areas 86 between each adjacent die 84 to result in a plurality of printhead actuator arrays attached to a plurality of printhead drive assemblies for use in a plurality of printheads. Each semiconductor wafer substrate assembly may be an entire undiced (e.g., unsingularized) semiconductor wafer, a diced portion of a semiconductor wafer, or another semiconductor substrate.

FIG. 9 depicts a printer 90 including a printer housing 92 into which at least one printhead 94 including an embodiment of the present teachings, for example a structure similar to that depicted in FIG. 7, has been installed. The housing 92 may encase the printhead 94. During operation, ink 96 is ejected from one or more nozzles 74 in one or more printheads 94. The printhead 94 is operated in accordance with digital instructions to create a desired image on a print medium 98 such as a paper sheet, plastic, etc. The printhead 94 may move back and forth relative to the print medium 98 in a scanning motion to generate the printed image swath by swath. Alternately, the printhead 94 may be held fixed and the print medium 98 moved relative to it, creating an image as wide as the printhead 94 in a single pass. The printhead 94 can be narrower than, or as wide as, the print medium 98. In another embodiment, the printhead 94 can print to an intermediate surface such as a rotating drum or belt (not depicted for simplicity) for subsequent transfer to a print medium 98.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B, means A alone, B alone, or both A and B. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

The invention claimed is:

1. A method for forming an ink jet printhead comprising an electrostatic actuator array, the method comprising:
   forming a plurality of actuator membranes on a first surface of an etch stop layer, wherein:
   each of the plurality of actuator membranes is laterally spaced from an adjacent actuator membrane;
   the etch stop layer is interposed between a handle layer and the plurality of actuator membranes; and
   the handle layer is attached to a second surface of the etch stop layer;
   attaching the plurality of actuator membranes to a printhead drive assembly, wherein the printhead drive assembly comprises circuitry for actuating the plurality of actuator membranes;
   subsequent to the attaching of the plurality of actuator membranes to the printhead drive assembly, removing the handle layer to expose the second surface of the etch stop layer using a method comprising:
   removing a first thickness of the handle layer using a first removal process having a first etch rate; then
   removing a second thickness of the handle layer to expose the etch stop layer using a second removal process having a second etch rate that is slower than the first etch rate; and
   subsequent to removing the handle layer, removing the etch stop layer.

2. The method of claim 1, further comprising:
   forming one or more standoff layers attached to the plurality of actuator membranes; and
   attaching an aperture plate comprising a plurality of nozzles therein to the one or more standoff layers to form a plurality of ink chambers, wherein each ink chamber is defined, at least in part, by a surface of an actuator membrane, a surface of the one or more standoff layers, and a surface of the aperture plate.

3. The method of claim 1, wherein:
   the handle layer is a semiconductor wafer; and
   the formation of the plurality of actuator membranes simultaneously forms a plurality of actuator membrane arrays for a plurality of ink jet printheads.

4. The method of claim 1, wherein:
   the forming of the plurality of actuator membranes on the first surface of the etch stop layer results in the formation of a plurality of silicon actuator membranes on an oxide etch stop layer; and
   the method further comprises forming the oxide etch stop layer on the handle layer, wherein the handle layer is an intact silicon semiconductor wafer.

5. The method of claim 4, further comprising:
   providing the silicon semiconductor wafer, wherein the silicon semiconductor wafer has a thickness of from 50 µm to 5,000 µm;
   forming the plurality of silicon actuator membranes to have a thickness of from 1.0 µm to 100 µm; and
   forming the oxide etch stop layer to have a thickness of from 0.5 µm to 25 µm.

6. The method of claim 1, wherein the forming of the plurality of actuator membranes comprises:

forming a blanket membrane layer on the etch stop layer;
forming a patterned mask on the blanket membrane layer; and
patterning the blanket membrane layer using the patterned mask as a pattern to form the plurality of actuator membranes.

7. The method of claim 1, wherein:
the forming of the plurality of actuator membranes forms a plurality of actuator membrane arrays for a plurality of printheads on a first semiconductor wafer;
the attaching of the plurality of actuator membranes attaches the plurality of actuator membrane arrays to a plurality of printhead drive assemblies for a plurality of printheads on a second semiconductor wafer; and
the method further comprises dicing the first semiconductor wafer and the second semiconductor wafer into a plurality of semiconductor dies for a plurality of printheads.

8. A method for forming an ink jet printer comprising an ink jet printhead having electrostatic actuator array, the method comprising:
forming a plurality of actuator membranes on a first surface of an etch stop layer, wherein:
each of the plurality of actuator membranes is laterally spaced from an adjacent actuator membrane;
the etch stop layer is interposed between a handle layer and the plurality of actuator membranes; and
the handle layer is attached to a second surface of the etch stop layer;
attaching the plurality of actuator membranes to a printhead drive assembly, wherein the printhead drive assembly comprises circuitry for actuating the plurality of actuator membranes;
subsequent to the attaching of the plurality of actuator membranes to the printhead drive assembly, removing the handle layer to expose the second surface of the etch stop layer using a method comprising:
removing a first thickness of the handle layer using a first removal process having a first etch rate; then
removing a second thickness of the handle layer to expose the etch stop layer using a second removal process having a second etch rate that is slower than the first etch rate;
subsequent to removing the handle layer, removing the etch stop layer; and
encasing the plurality of actuator membranes and the printhead drive assembly within a printer housing.

9. The method of claim 8, further comprising:
forming one or more standoff layers attached to the plurality of actuator membranes; and
attaching an aperture plate comprising a plurality of nozzles therein to the one or more standoff layers to form a plurality of ink chambers, wherein each ink chamber is defined, at least in part, by a surface of an actuator membrane, a surface of the one or more standoff layers, and a surface of the aperture plate.

10. The method of claim 8, wherein:
the handle layer is a semiconductor wafer; and
the formation of the plurality of actuator membranes simultaneously forms a plurality of actuator membrane arrays for a plurality of ink jet printheads.

11. The method of claim 8, wherein:
the forming of the plurality of actuator membranes on the first surface of the etch stop layer results in the formation of a plurality of silicon actuator membranes on an oxide etch stop layer; and
the method further comprises forming the oxide etch stop layer on the handle layer, wherein the handle layer is an intact silicon semiconductor wafer.

12. The method of claim 11, further comprising:
providing the silicon semiconductor wafer, wherein the silicon semiconductor wafer has a thickness of from 50 µm to 5,000 µm;
forming the plurality of silicon actuator membranes to have a thickness of from 1.0 µm to 100 µm; and
forming the oxide etch stop layer to have a thickness of from 0.5 µm to 25 µm.

13. The method of claim 8, wherein the forming of the plurality of actuator membranes comprises:
forming a blanket membrane layer on the etch stop layer;
forming a patterned mask on the blanket membrane layer; and
patterning the blanket membrane layer using the patterned mask as a pattern to form the plurality of actuator membranes.

14. The method of claim 8, wherein:
the forming of the plurality of actuator membranes forms a plurality of actuator membrane arrays for a plurality of printheads on a first semiconductor wafer;
the attaching of the plurality of actuator membranes attaches the plurality of actuator membrane arrays to a plurality of printhead drive assemblies for a plurality of printheads on a second semiconductor wafer; and
the method further comprises dicing the first semiconductor wafer and the second semiconductor wafer into a plurality of semiconductor dies for a plurality of printheads.

* * * * *